United States Patent [19]

Stacchiotti et al.

[11] 4,184,095
[45] Jan. 15, 1980

[54] QUARTZ CRYSTAL RESONATOR WITH SUPPLEMENTAL ELECTRODES FOR CONTROLLING THE Q FACTOR

[75] Inventors: Giuseppe Stacchiotti, Milan; Arturo Bellucci, Vimercate, both of Italy

[73] Assignee: Telettra Laboratori de Telafonia Elettronica E Radio S.p.A., Milan, Italy

[21] Appl. No.: 895,841

[22] Filed: Apr. 13, 1978

[30] Foreign Application Priority Data

Apr. 8, 1977 [IT] Italy .............................. 22268 A/77

[51] Int. Cl.² .............................................. H01L 41/10
[52] U.S. Cl. ............................... 310/366; 310/361
[58] Field of Search ............................. 310/366, 361

[56] References Cited
U.S. PATENT DOCUMENTS

| | | | |
|---|---|---|---|
| 2,635,199 | 4/1953 | Wolfskill | 310/366 |
| 3,465,178 | 9/1969 | Pardue | 310/366 |
| 3,495,105 | 2/1970 | Shimano | 310/366 |
| 4,091,303 | 5/1978 | Tadataka et al. | 310/361 X |

*Primary Examiner*—Mark O. Budd
*Attorney, Agent, or Firm*—Hubbell, Cohen, Stiefel & Gross

[57] ABSTRACT

An improved quartz crystal resonator of the type comprising an AT type cut quartz plate is provided in which the plate comprises metallized main electrodes on opposed surfaces thereof which are surrounded by spaced apart metallized supplementary control electrodes. The opposed surfaces of the plate provide a non-metallized unused portion for the plate over a substantial portion of the opposed surfaces. Each of the supplementary control electrodes has at least an associated parameter of width, thickness, density, air gap distance from the respective main electrode and an applied electrode potential and each of the main electrodes has at least an associated corresponding parameter. At least one of the associated parameters of the supplementary electrodes is different from the corresponding associated parameter for the respective main electrodes for controlling the associated Q- factor and frequency of the spurious resonance frequencies.

6 Claims, 9 Drawing Figures

GRAPH OF FREQUENCY VS. DISTANCE OF THE STRIP (FIG. 5)

QUARTZ CRYSTAL RESONATOR WITH SUPPLEMENTAL ELECTRODES FOR CONTROLLING THE Q FACTOR

BACKGROUND OF THE INVENTION

1. Field of the Invention

The present invention relates to resonators of the type having an AT type cut quartz plate and a pair of main electrodes applied to the plate to create an electric field, and more particularly to an improvement thereon for controlling undesirable resonance frequencies thereon.

2. Description of Prior Art

The wide use of quartz crystal resonators in the electronic field is well known, especially in filters and in oscillators. Conventional prior art resonators are generally composed of a quartz plate and a pair of electrodes applied on each surface of the plate. FIGS. 1-3 herein illustrate schematic representations of the well known prior art and shall briefly be described hereinafter in order to clarify ideas and to better outline the aspects of the technical field to which the present invention herein pertains.

In FIG. 1, a quartz crystal C is shown, defined by the three orthogonal axes $X_1$, $X_2$, $X_3$ in the conventional trigonal system of crystal architecture employed for the quartz crystal C. A quartz plate having an AT orientation is conventionally obtained by an AT cut from this crystal C and contains the a digonal axis $(X_1)$ and forms an angle of 35°15′ with the trigonal axis $(X_3)$ as shown illustratively in FIG. 1. For a better representation of the AT cut plate in FIG. 1 let us consider a plate one (L), rotated in an anti-clockwise direction about $(X_1)$ and $(X_2')$ and defined by the axes $(X_2')$, $(X_3')$ and $X_1$. FIG. 2 represents a partial schematic view of a portion of this plate L with axes $(X_1)$ and $(X_2')$ lying in the plane of the paper. T represents the thickness of plate L.

It is well known that if a suitable electric field E is applied to the small plate L in a direction $(X_2')$ (for example by means of the electrodes $El_1$ and $El_2$) a deformation (D) with respect to the median plane (M) (FIG. 2) is produced through a piezo-electric effect. This deformation generates an acoustic wave which, starting from the excitation point, propagates with a velocity which is a function of the mass and of the elasticity of the quartz and the geometry of the plate and of the electrodes (for example $El_1$ and $El_2$). In general, the electrodes in question are conventionally obtained by depositing metallic layers on the surface of the plate (L).

FIG. 3 represents a perspective view of a plate (L) of a parallelepipedon shape, which has in particular an upper surface $(F_1)$ and a lower surface $(F_2)$ separated by a thickness of quartz material T. The electrode $El_1$ consists of a metallic deposit, having rectangular boundaries 1 and 2 and a very small thickness 3 with respect to the thickness (T) of the plate. The rectangular portion of $(El_1)$ is extended by means of a lead $G_1$ to the edge 4 of plate (L) so as to form a terminal. The electrode $(El_2)$ is not visible in FIG. 3 because it is covered by $(El_1)$. Electrode $(El_2)$ must thus be imagined in the same position as $(El_1)$ but deposited on face $(F_2)$ of (L). Only the lead $(G_2)$ of electrode $(El_2)$ is indicated with dotted lines which terminate at edge 5 forming the second terminal. Conventional resonators of the type represented in FIG. 3 have the considerable inconvenience of exciting, besides the fundamental resonance frequency, a whole series of undesired or spurious resonance frequencies, the characteristics of which depend substantially on the geometry of the system consisting of the plate (L) and of the electrodes (for example $El_1$ and $El_2$). As a consequence, by acting suitably on these geometries it is possible to influence the position and the merit or Q- factor of the fundamental frequency and the spurious resonance frequencies. However, it is extremely difficult in the industrial manufacturing procedures employed for such resonators, on a large scale, to maintain geometries of plates and/or of perfectly identical electrodes and, therefore, it is difficult to succeed in manufacturing resonators with characteristics that coincide perfectly. Because of this, many inconveniences arise in the devices and the circuits in which these resonators are inserted which resonators, even though having substantially identical geometries (within the normal limits of industrial reproducibility), present very different characteristics. The present invention is directed to a resolution of the control and repeatability problem of the characteristics of such quartz resonators and overcomes the disadvantages of the prior art.

SUMMARY OF THE INVENTION

In a quartz crystal resonator of the type comprising an AT type cut quartz plate substantially defined by a pair of opposed surfaces spaced apart by a predetermined quartz thickness, each of said opposed surfaces having at least a main electrode applied thereon, each of said main electrodes at least having a respective active electric field generating portion which is superimposed with respect to the opposed surface main electrode, said active electric field generating portions each having an associated perimetral surface, said main electrodes being connectable to a first electric potential for generating a main electric field in said resonator, said resonator having an associated resonance frequency and Q-factor and associated spurious resonance frequencies; the improvement comprising at least one supplementary control electrode respectively applied to each of said opposed faces and being disposed thereon in surrounding relationship to the perimetral surface of the main electrode active electric field generating portion on said respective opposed face substantially in the form of an aureole, said supplementary control electrodes each having at least a respective active field generating portion which is superimposed with respect to the opposed surface supplementary control electrode, said supplementary control electrodes being connectable to a second electric potential for generating a supplementary electric field in said resonator, said generated supplementary electric field cooperating with said generated main electric field for controlling the associated Q-factor and frequency of at least the spurious resonance frequencies of said resonator.

Thus, the present invention enables the supply of quartz resonators having an additional control parameter which makes it possible to obtain improved characteristics with larger geometric tolerances.

DETAILED DESCRIPTION OF PREFERRED EMBODIMENTS

Figure 1:
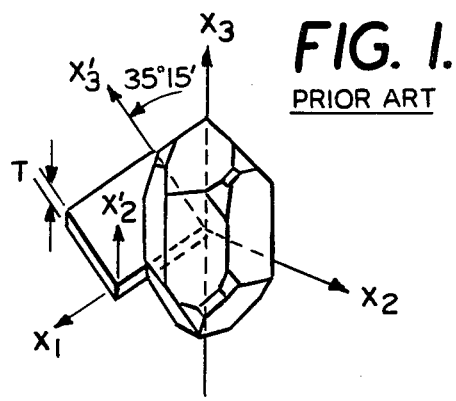
FIGS. 1 through 3 are diagrammatic illustrations of a prior art quartz crystal resonator of the AT cut type.
Figure 2:
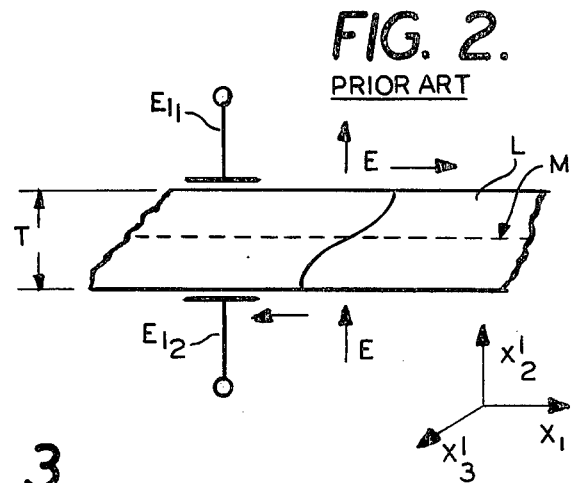
Figure 3:
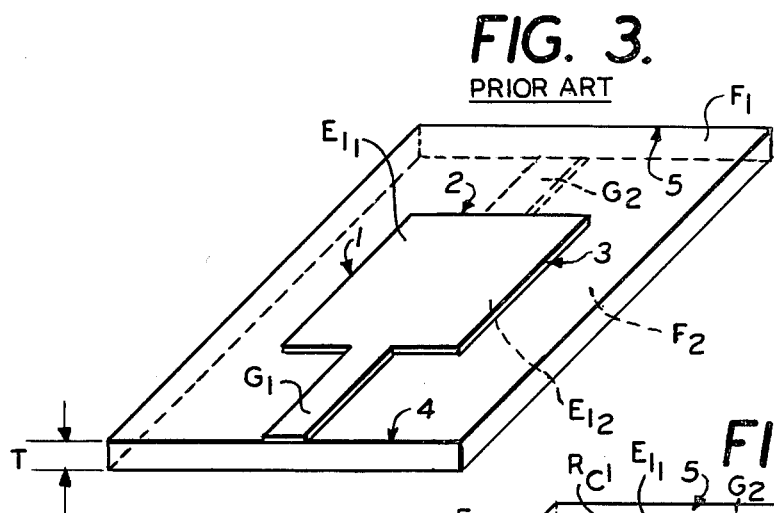
Figure 4:
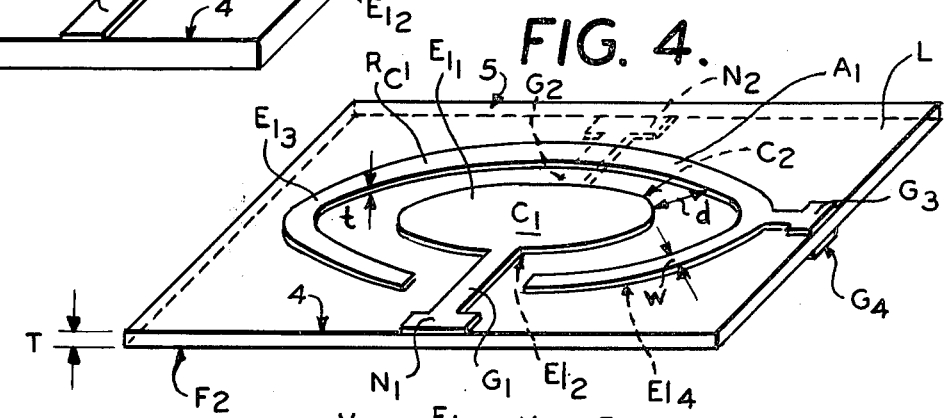
FIG. 4 is a perspective view of an improved quartz crystal resonator in accordance with the present invention.
Figure 5:
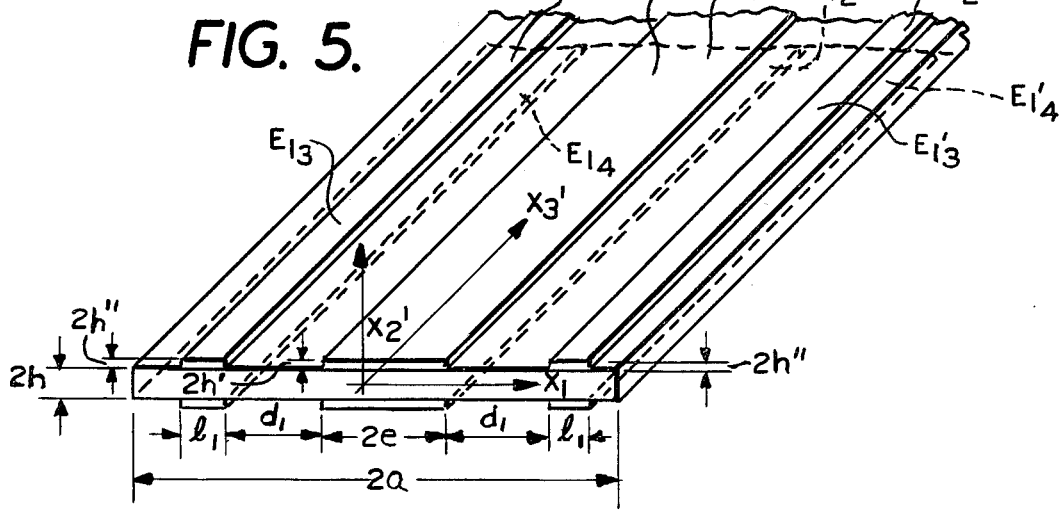
FIG. 5 is a perspective view of a general configuration of an improved quartz crystal resonator in accordance with the present invention.

Referring now to the drawings in detail, and initially to FIGS. 4 and 5, the improved quartz crystal resonator of the present invention has at least one supplementary control electrode arranged as per an aureole or halo type arrangement in surrounding relationship with each main electrode. Preferably, the supplementary control electrodes have a conformation corresponding to that of the main electrodes and they are arranged at a predetermined distance from the latter. The different aspects and advantages of the present invention will appear more clearly from the description of one of the preferred realisation forms of the invention, as represented by the embodiments of FIGS. 4 and 5. In FIG. 4 a quartz crystal resonator in accordance with the present invention is represented in perspective; (L) again indicating the quartz plate defined by an upper surface ($F_1$), by a lower surface ($F_2$) and by the quartz thickness (T). Also in this case it has been preferred, to make it easier to understand the invention and to conserve its generality aspect, to represent a plate (L) having a parallelipipedon shape with preferably square or rectangular surfaces. However, it is evident that the shape of the plate can also be different from the one represented. The electrodes ($El_1$) and ($El_2$) (the latter hidden by $El_1$) are shown represented as if consisting of a substantially circular surface ($C_1$) connected to the lead ($G_1$) which forms, with its enlarged end ($N_1$) in correspondence to the edge (4) of (L), a terminal to be connected to a source of voltage potential $V_1$ (generally DC voltage) not shown in FIG. 4. The hidden electrode ($El_2$) also consists of a greater portion ($C_2$) with a substantially circular surface connected to the lead ($G_2$) which extends itself with the widening ($N_2$) up to the edge 5 of the plate (L).

The circular surfaces of the two electrodes, that is ($C_1$) and ($C_2$), are generally perfectly superimposed on the respective faces ($F_1$) and ($F_2$). The electric field (E) (not represented), which is generated by the electrodes ($El_1$) and ($El_2$) when the voltage is applied thereto, is developed almost exclusively on the greater portions ($C_1$) and ($C_2$), the leads ($G_1$) and ($G_2$) participating only slightly or not at all in the creation of this electric field. The same leads ($G_1$) and ($G_2$) are not shown as being superimposed. As can also be seen from FIG. 4, the lead ($G_2$) is aligned with ($G_1$), but is located on the plate side opposite to the one occupied by ($G_1$). If desired, however, ($G_2$) can occupy a different position from that represented in FIG. 4; for example, being disposed orthogonally relative to ($G_1$), or in any other position, not superimposed with that of ($G_1$). Therefore, the mechanical forces that derive from the electric field essentially only act on the greater surfaces ($C_1$) and ($C_2$) of the electrodes ($El_1$) and ($El_2$).

In accordance with the present invention, an additional pair of supplementary control electrodes ($El_3$) and ($El_4$) are preferably arranged around the electrode surfaces ($C_1$) and ($C_2$), which are the active electric field generating portions of the electrodes ($El_1$) and ($El_2$), with supplementary control electrode ($El_4$) being hidden in FIG. 4 since it is preferably superimposed with supplementary control electrode ($El_3$), with these electrodes ($El_3$) and ($El_4$), in turn, being provided with leads ($G_2$) and ($G_4$) that create two additional terminals of the resonator. Electrodes ($El_3$) and ($El_4$) are connectable to a second voltage potential $V_2$ (not shown) for generating a supplementary electric field which cooperates with the electric field generated by electrodes ($El_1$) and ($El_2$). According to an advantageous aspect of the invention, the supplementary control electrodes ($El_3$) and ($El_4$) are such as to preferably substantially surround the perimetral surface of the active electric field generating portions ($C_1$) and ($C_2$) of the main electrodes ($El_1$) and ($El_2$). In the embodiment represented in FIG. 4, since the surfaces of active portions ($C_1$) and ($C_2$) have a circumferential configuration, the supplementary electrodes ($El_3$) and ($El_4$) are each preferably conformed in the form of an aureole or ring like configuration that substantially wraps around or surrounds active portions ($C_1$) and ($C_2$). The ring like portions ($A_1$) and ($A_2$) of electrodes ($El_3$) and ($El_4$), respectively, are preferably substantially characterized by an annular width (W) having a distance (d) between the external perimeter of active portion ($C_1$) and the internal perimeter of ring like portion ($A_1$), as well as by the thickness t of the metal deposit that preferably forms the ring like portions ($A_1$) and ($A_2$), respectively. The leads ($G_3$) and ($G_4$) of the supplementary electrodes ($El_3$) and ($El_4$) may also be superimposed, as represented in FIG. 4, even if their superimposition is not determinant in the least.

It has been found by applicants that the presence of the supplementary electrodes ($El_3$) and ($El_4$), and in particular in their arrangement in the form of an aureole or ring like or halo configuration created around or surrounding the active portions ($C_1$) and ($C_2$) of each of the main electrodes ($El_1$) and ($El_2$), respectively, makes it possible to influence the spectrum of the spurious or undesirable resonance frequencies in the resonator. In addition, by varying the distance of the aureole or ring like portions ($A_1$) and ($A_2$) with respect to active portions ($C_1$) and ($C_2$), respectively, and/or its essential geometric parameters, that is, the annular width (W) and the thickness (t) of the layer, tremendous flexibility exists in controlling the spurious resonance frequencies of the resonator.

To this end, in FIG. 5, a plate in accordance with the present invention has been represented in its greatest generality, fitted with conventional main electrodes ($El_1$) and ($El_2$), superimposed, and with the aforementioned supplementary control rings or electrodes ($El_3$) and ($El_4$), which are also preferably superimposed. In FIG. 5, for purposes of analytical rigor, the quartz plate (L) has been imagined as having an infinite length in the direction of the ($X_3'$) axis; hence the main electrodes ($El_1$) and ($El_2$) have been shown as two superimposed layers having an infinite length in the direction of the ($X_3'$) axis. Analogously the supplementary control electrodes ($El_3$) and ($El_4$) have been represented, each by a pair of layers ($El_3$) and ($El_3'$) and ($El_4$) and ($El_4'$), respectively, having an infinite length in position on the one side and on the other of the electrode ($El_1$) and ($El_2$), so as to efficiently represent the aureole effect that they produce on the central electrode ($El_1$) and ($El_2$). In FIG. 5 the thickness of the plate (L) has been indicated by 2h, the thickness of the electrodes ($El_1$) and ($El_2$) with 2h' and the thickness of the supplementary electrodes (El$_3$) and (El$_4$) with 2h''. The widths are indicated as follows:
2a=plate width (L)
2e=width of the electrodes (El$_1$) and (El$_2$)
l$_1$=width of the electrodes formed with aureole (El$_3$) and (El$_4$)

The annular or air gap distance between the electrodes (El$_1$) and (El$_2$) and the supplementary electrodes (El$_3$) and (El$_4$), respectively, is indicated with (d$_1$). (V$_1$) and (V$_2$) in FIG. 5 represent the voltage applied to (El$_1$) and (El$_2$), and (El$_3$) and (El$_4$), respectively. Analytically it is now possible to determine with accuracy the frequency and the merit or Q- factor of the spurious resonance frequencies associated with the resonator as a function of the above mentioned characteristics of the electrodes and of the plates.

By referring to FIG. 5, let us consider the deformation constituted by the rotation about the axis (X$_3$') of the initially perpendicular plane to the (X$_1$) axis. If $\Psi_1$ is the value of this rotation, the equations that describe the propagation are, to a good approximation (1), the following: [(1) "LinearPiezo electric Plate Vibration", 1969 Plenum Press, N.Y.] In the non-metalized region (area without superimposition of electrodes):

$$\frac{2h^3}{3}[\gamma_{11} + k_1^2 C_{66}]\frac{\partial^2 \Psi_1}{\partial x_1^2} - 2hk_1^2 C_{66}\Psi_1 = \frac{2h^3}{3}\rho\frac{\partial^2 \Psi}{\partial t^2} \quad (1)$$

In the metalized area (wherever there is superimposed metalization (i=1,2 respectively between El$_1$, El$_2$ El$_3$, El$_4$)

$$\frac{2h^3}{3}[\gamma_{11} + (1 + 2R_i)\overline{k_i}^2 C_{66}]\frac{\partial^2 \overline{\Psi}_{1i}}{\partial x_1^2} - 2h\overline{k_i}^2 C_{66}\overline{\Psi}_{1i} - \quad (2)$$

$$\overline{K_i}e_{26}V_i = \frac{2h^3}{3}\rho(1 + 3R_i)\frac{\partial^2 \overline{\Psi}_{1i}}{\partial t^2}$$

with the following significance of the symbols:
$\rho$ quartz density
$\rho'$ density of the deposited material
$R_i = 2\rho' h_i'/\rho h$ ratio of combined mass per unit area of both electrodes to mass per unit area of the plate.
$\gamma_{11} = 85.93$ N/m$^2$
$C_{66} = 29.01$ N/m$^2$
$l_{26} = 0.095$ C/m$^2$ mechanical and electric constants
$\epsilon_{22} = 39.82 \cdot 10^{-12}$ F/m of the material $$k_i^2 = \frac{TC^2}{12}[\lambda + \frac{e^2_{26}}{\epsilon_{22} C_{66}}; \overline{k_i}^2 = k_i^2 \frac{\lambda + 3R_i}{\lambda + R_i}$$

are correction coefficients.

By resolving equations (1) and (2) for each area of the plate and imposing the boundary conditions: (1)
(a) continuity of the deformation $\Psi_1$ at the jointbetween the metalized and non-metalized area;
(b) continuity of the $J\Psi_1/JX_1$;
(c) by annulling the function $\Psi_1$ at the external edge of the plate, it is possible to obtain the value of $\Psi_1$ in each point.

By knowing the deformation it is possible to calculate the current (I) that crosses the plate (L): with D$_2$(o) being the mean value of the electric displacement in the thickness.

Frequencies exist for which (I) is infinite (resonance frequency (fris) of electromechanical system) and, alternately, frequencies for which (I) is null (frantir, antiresonance frequency). A parameter suited to represent the Q- of the resonance is:
(3) F=(fris−fantir)/fris The value of the frequencies of F depend, as has been stated, on the geometry of the system and the applied value of (V$_1$) and (V$_2$) (voltages applied to the electrodes (El$_1$), (El$_2$) and (El$_3$), (El$_4$)). The reasoning is analogous for a plate having infinite dimensions along (X$_1$) long and with dimensions (2b) along (X$_3$'), (it is sufficient to substitute the value of a number of sizes). FIGS. 6–9 are graphic illustrations which represent, as a function of different conditions relative to the supplementary electrodes (A$_1$) and (A$_2$) aureoles around the main (El$_1$) and (El$_2$) electrodes and the frequency of the various spurious resonance frequencies associated with the fundamental resonance frequency of a resonator having the following dimensions:
Plate thickness (L) 2h=380.6
Plate width (L) 2a=14 mm (X$_1$ axis)
Plate length (L) 2b=15 mm (X$_3$'axis)
Electrode width (El$_1$), (El$_2$)=6.28 mm.
Electrode width (El$_1$), (El$_2$)=5.022 mm.
fundamental frequency 4287 KHz
R$_1$=0.0216
R$_2$=0.0198.

Figure 6:
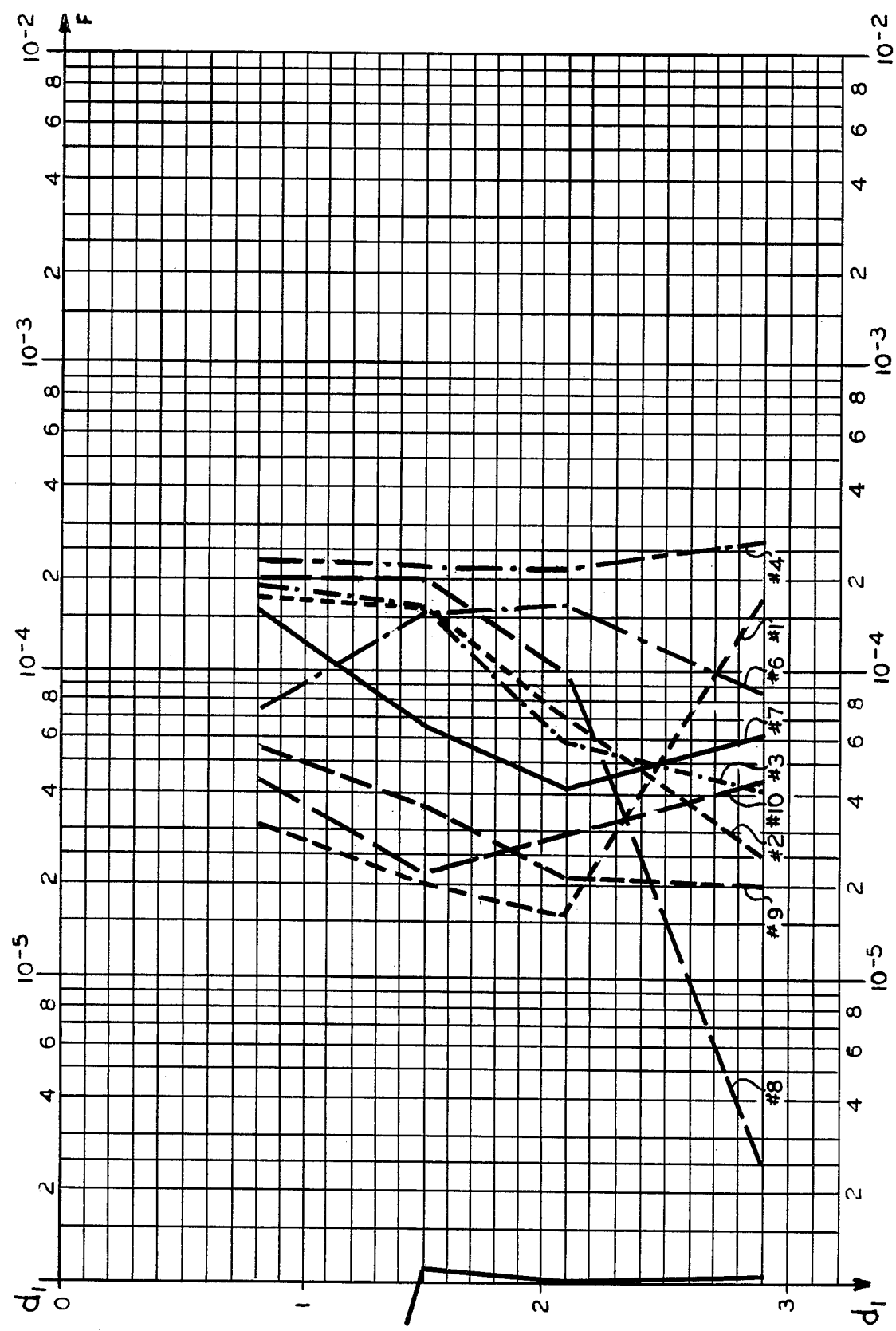
FIGS. 6 through 9 are graphic illustrations relating to the operation of the improved quartz crystal resonator of the present invention.

The diagram of FIG. 6 illustrates the variation of intensity (I) of the Q- factor of resonance frequency (F) in accordance with equation (3), for each of the first spurious resonance frequencies from n1 to n10 as the distance (d$_1$) in FIG. 5 varies; that is, as the air gap between electrode (El$_1$), (El$_2$) and the (A$_1$) and (A$_2$) aureoles in the form of a ring varies, with
V$_1$=1 Volt,
V$_2$=0 Volt, and
l$_1$=0.6 mm.

Figure 7:
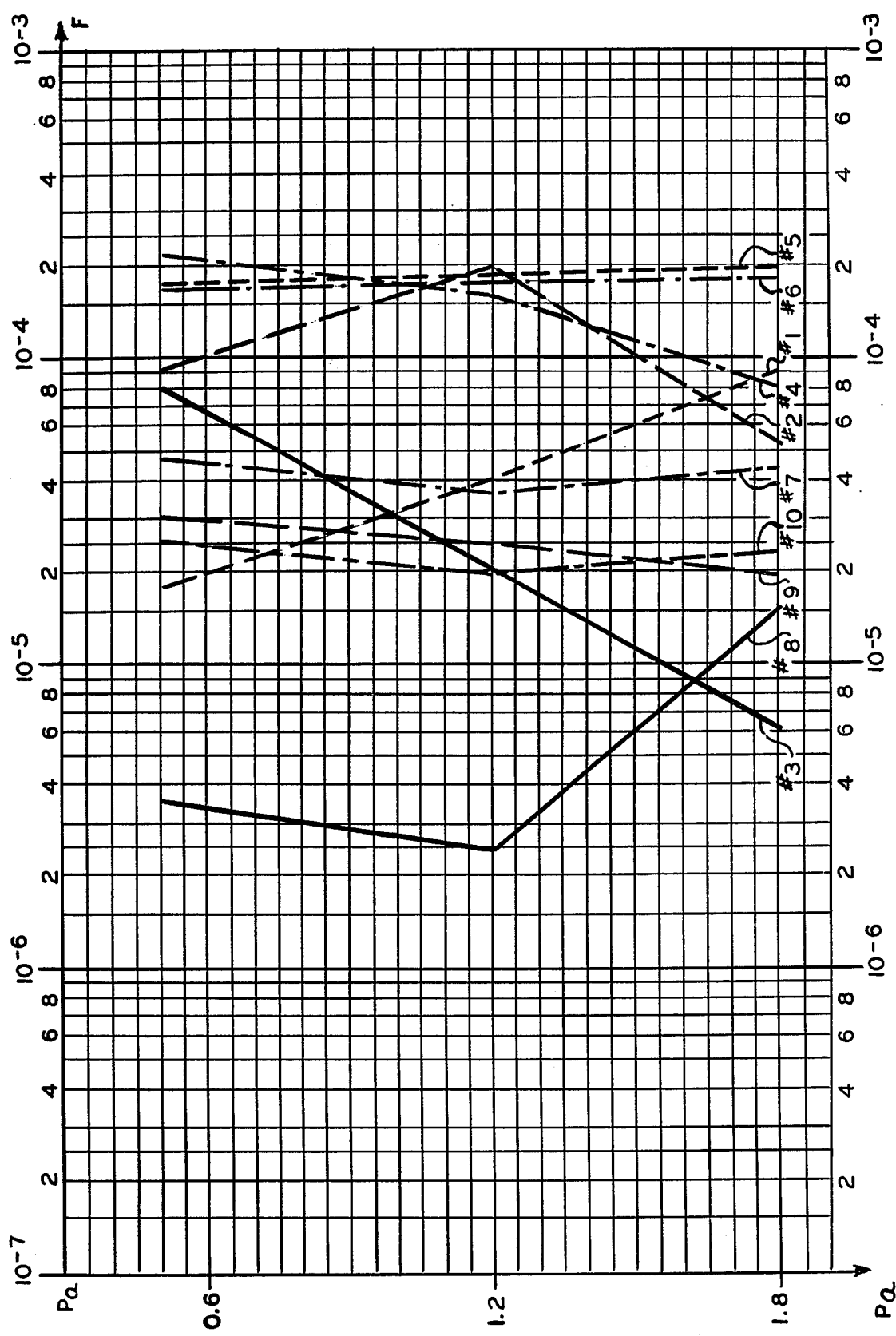
Figure 8:
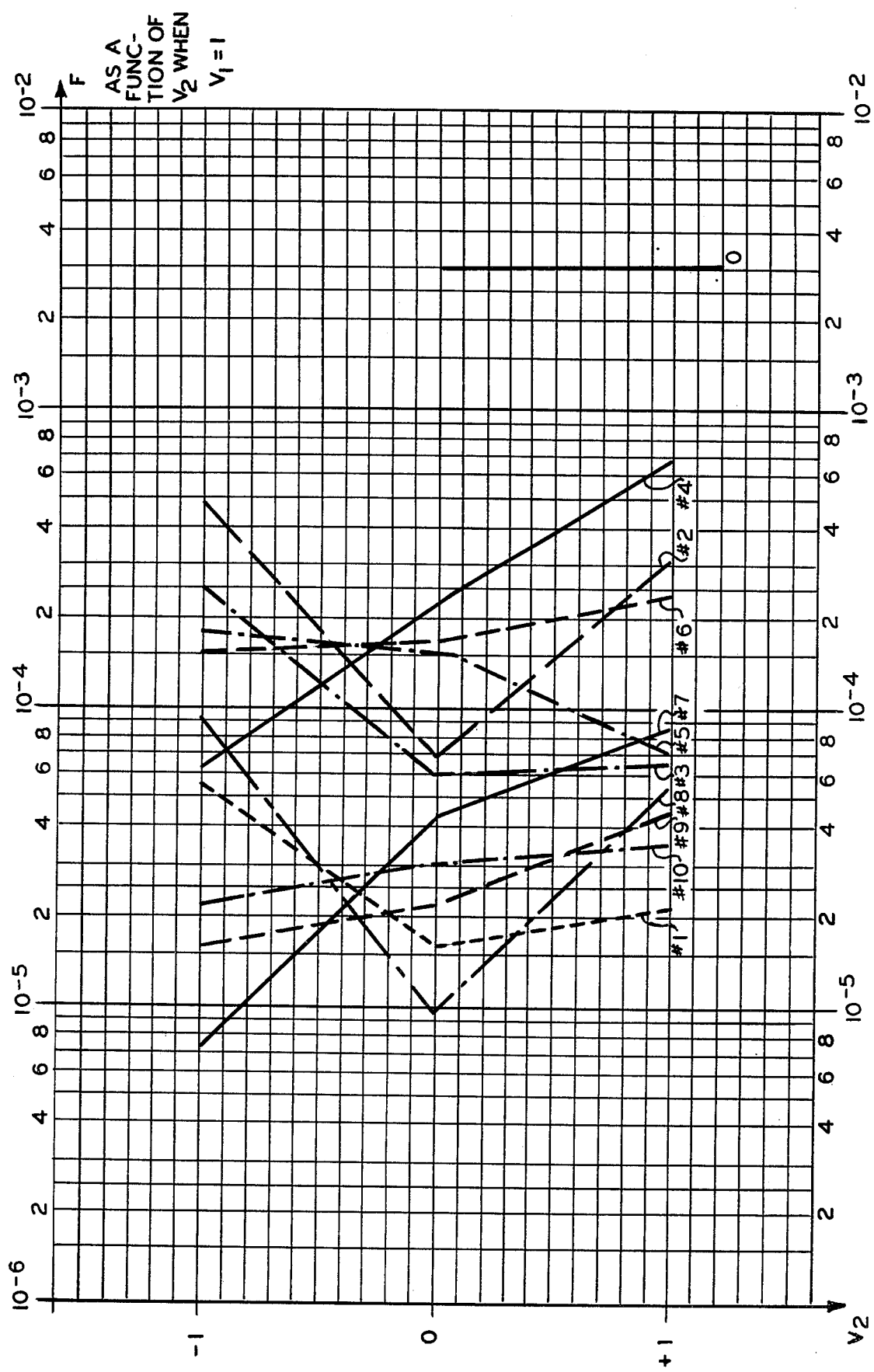

The diagram of FIG. 7 illustrates the trend of the depth of resonance frequency (F) as the annular width (l$_1$) (FIG. 5) changes corresponding to (w) in FIG. 4 with d$_1$=2.2−l$_1$/2. The diagram of FIG. 8 illustrates the trend of resonance frequency (F) as a function of the voltage (V$_2$) on the aureole (A) with:
V$_1$=1 Volt,
d$_1$=2.2 mm.,
l$_1$=0.6 mm.

Figure 9:
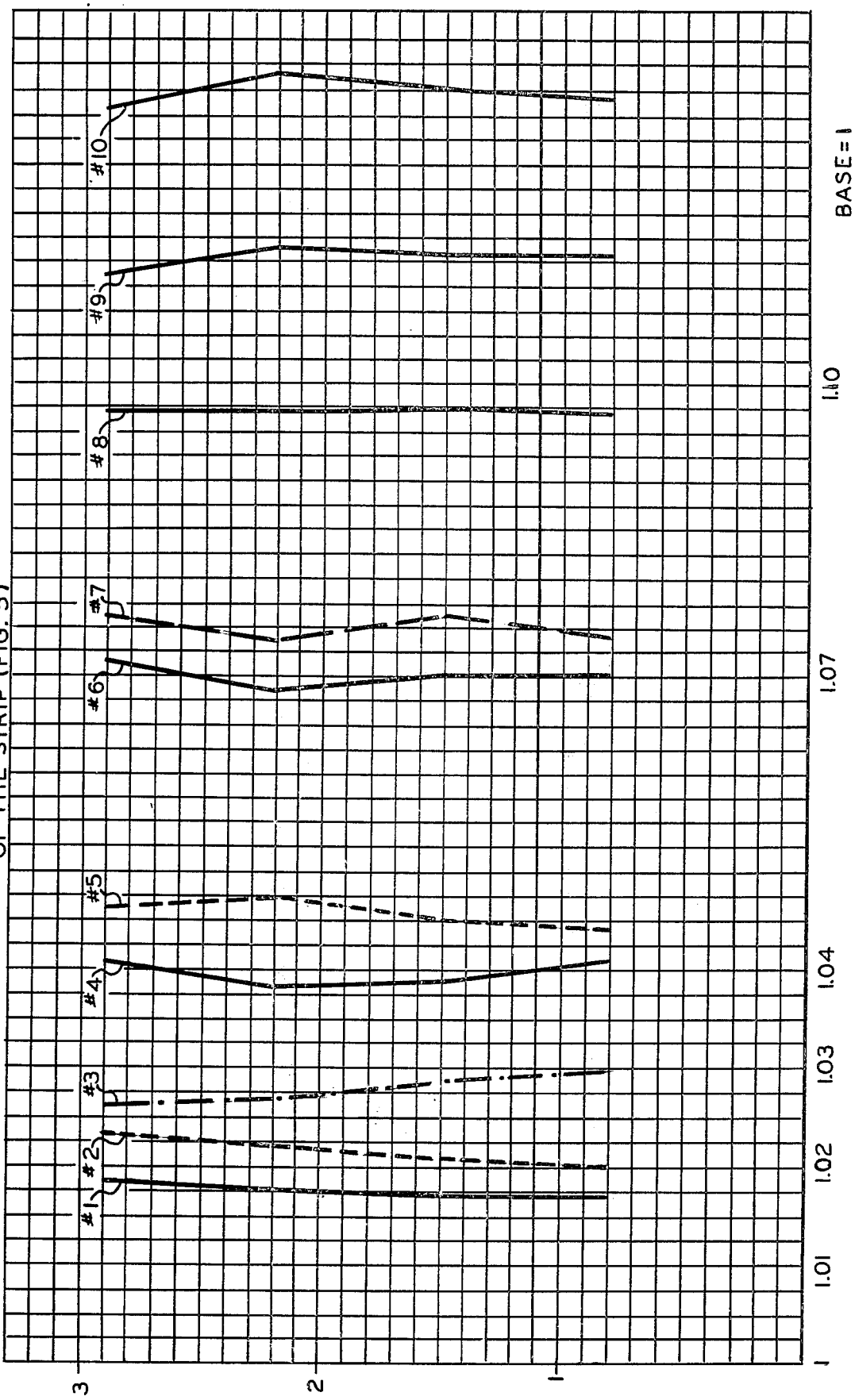

The graph of FIG. 9 illustrates the variation of the frequency defined as the ratio between fa/fo as the distance of the strip (El$_3$), from the main electrode (El$_1$), (El$_2$) varies and for a strip (El$_3$), (El$_4$) 0.6 mm. wide.

The above described embodiments of the present invention are merely illustrative thereof and numerous modifications may be made therein without departing from the spirit and scope of the present invention.

What is claimed is:

1. In a quartz crystal resonator of the type comprising an AT type cut quartz plate substantially defined by a pair of opposed surfaces spaced apart by a predetermined quartz thickness, each of said opposed surfaces having at least a main electrode applied thereon, each of said main electrodes at least having a respective active electric field generating portion which is superimposed with respect to the opposed surface main electrode, said active electric field generating portions each having an associated perimetral surface, said main electrodes being connectable to a first electric potential for generating a main electric field in said resonator, said resonator having an associated resonance frequency nd Q- factor and associated spurious resonance frequencies; the improvement comprising at least one metallized supplementary control electrode respectively applied to each of said opposed faces and being disposed thereon in surrounding relationship to the perimetral surface of the main electrode active electric field generating portion on said respective opposed face substantially in the form of an aureole, said main electrode being metallized and said opposed surfaces being non-metallized and providing a non-metallized unused portion for said plate over a substantial portion of said opposed surfaces, said supplementary control electrodes each having at least a respective active field generating portion which is superimposed with respect to the opposed surface supplementary control electrode, said suplementary control electrodes being connectable to a second electric potential for generating a supplementary electric field in said resonator, each of said supplementary control electrodes having at least an associated parameter of width, thickness, density, air gap distance from said respective main electrode, and applied second electric potential, each of said main electrodes having at least an associated corresponding parameter of width, thickness, density and applied first electric potential, at least one of said associated parameters of said supplementary electrodes being different from said corresponding associated parameter for said respective main electrodes for controlling said associated Q-factor and frequency of said spurious resonance frequencies, said generated supplementary electric field cooperating with said generated main electric field for controlling the associated Q-factor and frequency of at least the spurious resonance frequencies of said resonator.

2. An improved quartz crystal resonator in accordance with claim 1 wherein said quartz plate has an associated plate width, thickness and density, each of said supplementary control electrodes being disposed on said respective opposed surface at said associated predetermined air gap distance from the respective main electrode on said opposed surface; said associated Q-factor and frequency of the fundamental and spurious frequencies of said resonator being controllable as a function of the parameters of said first and second electric potentials, and the parameters of said associated plate, main and supplementary electrode and the respective air gap distance therebetween, whereby controllable variations in said parameters controllably vary said associated Q-factor and frequency of at least the spurious resonance frequencies of said resonator.

3. An improved quartz crystal resonator in accordance with claim 1 wherein each of said supplementary control electrodes has a configuration conforming to the configuration of the respective opposed face surrounded main electrode and is disposed on the respective opposed face from said respective main electrode at said predetermined air gap distance therefrom.

4. An improved quartz crystal resonator in accordance with claim 1 wherrein said supplementary control and main electrodes are substantially annular and have analogous directrix curves.

5. An improved quartz crystal resonator in accordance with claim 1 wherein said supplementary control electrodes are applied to the respective opposed faces by depositing metal thereon.

6. An improved quartz crystal resonator in accordance with claim 4 wherein said main electrodes have an elliptical configuration and said respective surrounding supplementary annular control electrodes have an elliptical directrix curve analogous to that of said main electrode.

* * * * *